Sept 10, 1957 G. E. DUNN, JR 2,805,968

SEMICONDUCTOR DEVICES AND METHOD OF MAKING SAME

Filed Feb. 8, 1956

INVENTOR.
GEORGE EDGAR DUNN, JR.
BY J. C. Whittaker
ATTORNEY

United States Patent Office 2,805,968

Patented Sept. 10, 1957

2,805,968

SEMICONDUCTOR DEVICES AND METHOD OF MAKING SAME

George Edgar Dunn, Jr., Jersey City, N. J., assignor to Radio Corporation of America, a corporation of Delaware Application February 8, 1956, Serial No. 564,204

6 Claims. (Cl. 148—1.5)

Figure 1:
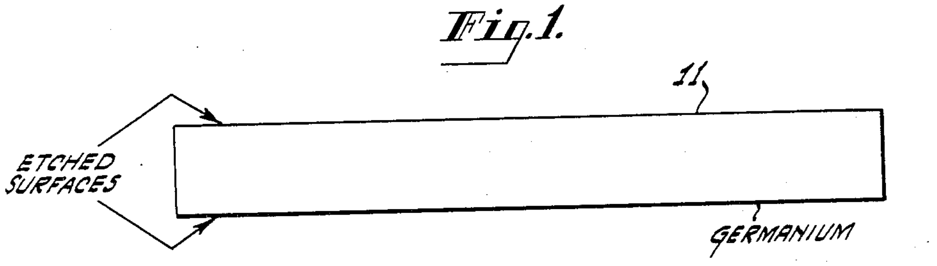

This invention relates to semiconductor devices and particularly to improved methods of making junction type semiconductor devices with uniform electrical characteristics.

A typical junction device of this class is the transistor, which comprises a semiconductor wafer with at least two P–N junctions as rectifying barriers, and at least three electrodes, usually called emitter, collector, and base. In one method of manufacture of transistors, a pellet of a material which produces conductivity of one type in a semiconductor material is contacted to a surface of a semiconductor wafer of the opposite conductivity type. Heat is then applied to melt the pellet material and alloy it into the surface of the semiconductor wafer, thus forming a P–N junction at the interface of the two conductivity regions. A serious problem in this method is the excessive and irregular lateral spread of the pellet material over the surface of the semiconductor wafer during the alloying step. The spreading of the pellet material produces unsatisfactory devices for three reasons: first, the excessive spread of the pellet material may cause a short circuit to the base electrode; second, the spreading of the pellet material causes excessive collector capacitances; third, irregular spreading causes junctions of variable size and shape, which results in variable electrical characteristics when flat junctions with uniform electrical characteristics are desired. The excessive lateral spread of the pellet material is particularly marked when purified semiconductor material having a low edge dislocation density is used.

There have been many attempts to solve this problem. One method has been to confine the spreading of the pellet to the desired area on the semiconductor wafer by coating the remaining surface of the wafer with a thin inert film, which prevents the pellet material from wetting that portion of the semiconductor wafer which is protected by the film, and thereby confines the lateral spreading of the pellet material to the film-free portion of the wafer. Films previously used for this purpose have been germanium oxide, silicon monoxide, silicon dioxide, and magnesium fluoride. The film used should be stable during the heating cycle of the alloying step, and should be easily removable from the semiconductor wafer when the alloying is completed. Although satisfactory devices have been made with the films previously used, further improvements as to heat stability and ease of removal of the film are desirable.

An object of the present invention is to provide improved methods of making semiconductor devices of the alloy junction type having uniform electrical characteristics.

Another object of the invention is to provide improved methods of making semiconductor devices with one or more rectifying barriers.

Another object of the invention is to provide improved methods of making semiconductor devices of the alloy junction type using an improved film for coating semiconductor wafers to prevent excessive lateral spreading of pellet material during alloying.

These and other objects of the invention are accomplished in the following manner: after a wafer of semiconductive material, for example, germanium, has been suitably prepared, a mask is placed on one face thereof and a thin inert film of magnesium hydroxide is deposited upon the wafer face except where the mask is located. The process may then be repeated upon the opposite face of the semiconductor wafer. Pellet materials, for example indium, are then alloyed into the germanium wafer at the film-free site to produce rectifying barriers. The magnesium hydroxide film prevents excessive lateral spreading of the pellet material over the face of the semiconductor wafer during the alloying process.

Figure 2:
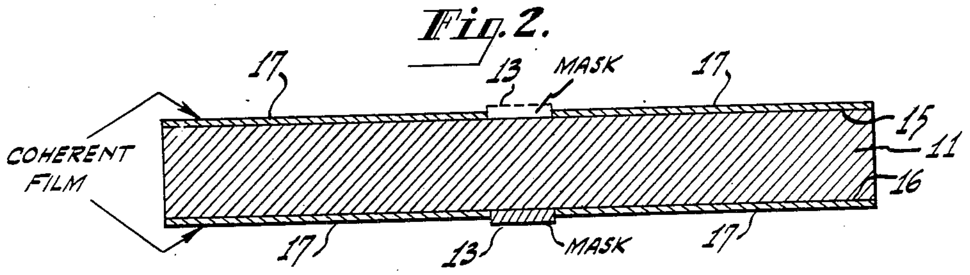
Figure 3:
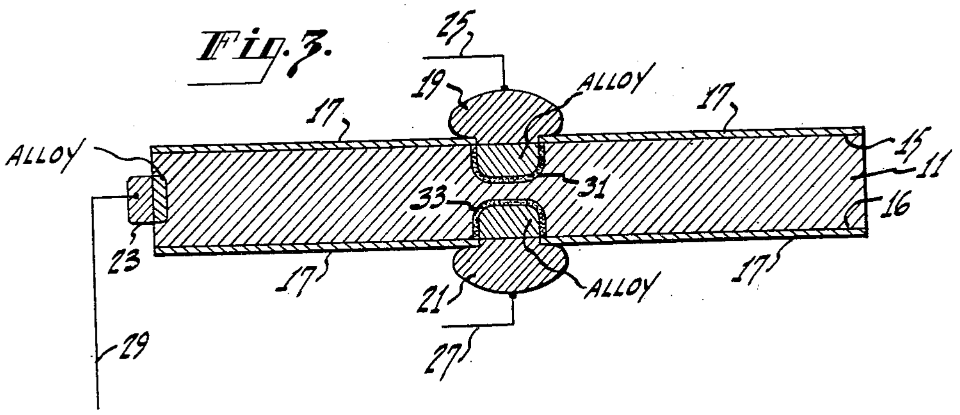

The invention will now be explained in greater detail with reference to the accompanying drawing, in which Figures 1 through 3 are schematic diagrams illustrative of the method of fabricating semiconductive devices according to this invention.

Similar reference characteristics are applied to similar elements throughout the drawing.

Referring to Figure 1 of the drawing, a wafer of semiconductive crystalline material such as germanium or silicon is shown at 11. For purposes of illustration it will be assumed that the material is N-type germanium. Initially, the wafer of germanium 11 is etched, and washed in distilled water at room temperature, next dried in a blast of hot dust-free air which is at a temperature of about 60° C.

Referring to Figure 2 of the drawing, a mask 13 of selected size and shape is then placed on one face 15 of the germanium wafer 11. The mask may be made of any material which does not react chemically with the germanium. Discs of copper, stainless steel, or mica will be satisfactory for this purpose. The mask is made to correspond with the electrode shape which is subsequently desired. Thereafter a thin coherent inert film of magnesium hydroxide is deposited over the semiconductive wafer forming an adherent film 17 on the semiconductor face 15. The film may be applied by any convenient technique. The film may be applied by dipping the semiconductor body into a water suspension of approximately 2% magnesium hydroxide, or painting the same suspension on the semiconductor wafer with a brush, or spraying the suspension on the semiconductor wafer with an air gun. The exact concentration of the suspension is not critical. The mask 13 is then removed and may be placed on the opposite face 16 of the semiconductor wafer, and the process repeated whereby a second protective film 17 is deposited on the semiconductor face 16.

Referring to Figure 3 of the drawing, after the mask 13 has been removed from contact with face 16, a pellet 19 of P-conductivity type forming material such as indium is placed on that portion of the semiconductor face 15 that was masked during the deposition of the magnesium hydroxide film. The assembly of wafer and pellet is then heated in an atmosphere of dry hydrogen. The temperature is raised at the rate of 20° C. per minute until 550° C., kept three minutes at 550° C., and then cooled at the rate of 20° C. per minute to room temperature. Instead of indium, other P-type materials such as boron, aluminum or gallium may be used. A second pellet 21 of indium is then placed in contact with the previously masked portion of the opposite face 16 of the semiconductor wafer. A slab 23 of tin is placed in contact with the body of the germanium wafer at some other exposed portion or edge, and the assembly is heated in a reducing atmosphere as before. The pellets 19 and 21 are thus alloyed into the semiconductor wafer 11. The slab of tin 23 forms a low resistance non-rectifying ohmic contact to the germanium wafer 11. Terminal leads 25, 27 and 29 may then be soldered or otherwise joined to the electrodes 19, 21 and 23 by well known techniques.

As a result of the alloying of material from pellets 19 and 21, and subsequent re-crystallization of the germanium of the wafer, rectifying barriers 31 and 33 are established, which have been exaggerated in size for purposes of illustration. The film of $Mg(OH)_2$ begins to decompose when heated over 350° C., and leaves a film comprising magnesium oxide, which has the same desirable characteristics of preventing the lateral spread of the pellet and of being easily removable when desired, in addition to being very thermostable. The conversion of magnesium hydroxide to magnesium oxide may not be complete, depending on how long it is heated and the temperature attained.

This method may be modified to omit the use of a mask, where the impurity pellet is to be attached to the semiconductor body. The indium pellet is placed on the desired site on the surface of the semiconductor wafer. The assembly is then heated for 3 minutes at about 300° C. This temperature is too low to alloy the indium into the germanium, but is sufficient to solder the pellet to the wafer at the desired site. The rest of the semiconductor surface is then coated with a film of magnesium hydroxide and thereafter alloyed by heat treatment as described in the previous example.

The film of magnesium hydroxide deposited on the face of the germanium wafer restricts the lateral spreading or surface diffusion of the pellet. Hence, the barriers 31 and 33 will be of uniform size and shape, which enables the manufacture of semiconductor devices with satisfactory and uniform electrical characteristics. An important advantage is that the film is stable during the heating steps used in manufacture of alloy junction devices. Another important advantage of this invention is that the film of magnesium hydroxide and the film of magnesium oxide formed during the heating cycle may be readily removed whenever desired by dipping the semiconductor crystal in a 30% solution of acetic acid which is later rinsed off. The device may thereafter be mounted and encapsulated by standard methods, whether the film is removed or not.

It will be readily apparent to those skilled in the art that although this method has been described in terms of P-forming pellets on a wafer of N-type germanium, the same method applies for using N-forming pellets such as arsenic, antimony or bismuth on a wafer of P-type germanium. Although this invention has been described in terms of a pellet of elements such as boron, aluminum, gallium, indium, arsenic, antimony and bismuth, there may be used instead any desired alloy that will introduce a region of opposite conductivity to that of the crystalline semiconductor wafer. Other semiconductive materials such as silicon may be used instead of germanium without departing from the spirit and scope of the invention.

There thus has been described an improved method of making crystalline semiconductor devices with improved uniform flat rectifying barriers, which produces P-N junction devices with more uniform electrical characteristics.

What is claimed is:

1. The method of fabricating an electrical junction device comprising the steps of applying to one portion of a surface of a crystal semiconductor wafer a thin adherent and coherent film of magnesium hydroxide, and applying to the adjacent film-free surface a quantity of electrode material, and treating said electrode material to form a rectifying barrier therebeneath.

2. The method of fabricating an electrical junction device comprising the steps of applying to a predetermined portion of a surface of a crystal semiconductor wafer of one conductivity type a thin adherent and coherent film of magnesium hydroxide, while leaving another adjacent portion of said semiconductor surface free of film, and alloying into said film-free portion a pellet of material capable of imparting to said semiconductor wafer conductivity of the oposite type, so that the lateral spreading of said pellet over the surface of said semiconductor wafer is limited to the said film-free portion.

3. The method according to claim 2 in which said semiconductor wafer is made of N-type germanium and said pellet is made of material capable of changing said germanium to P-type germanium.

4. The method of fabricating an electrical junction device comprising the steps of applying to one predetermined portion of a surface of a crystal semiconductor wafer of one conductivity type a thin adherent and coherent film of magnesium hydroxide, while leaving another adjacent portion of said semiconductor surface free of film, and diffusing into said film-free portion a pellet of material capable of imparting to said semiconductor wafer conductivity of the opposite type, so that the lateral spreading of said pellet over the surface of said semiconductor wafer is limited to the said film-free portion.

5. The method of fabricating a semiconductor device comprising the steps of etching a semiconductor wafer of one conductivity type, contacting to a desired site on the wafer surface a pellet of electrode material capable of imparting to said wafer conductivity of the opposite type, soldering the pellet to the desired site by heating at a temperature which is too low to cause alloying, applying to the surface of the wafer a thin adherent film of magnesium hydroxide, and alloying the pellet into the wafer to form a rectifying barrier therebeneath.

6. A circuit element comprising a body of a solid semiconductor, a rectifying electrode in a portion of said body, and an inert adherent and coherent film comprising magnesium hydroxide and magnesium oxide disposed over at least part of the surface of said body adjacent said electrode.

References Cited in the file of this patent

UNITED STATES PATENTS

| | | |
|---|---|---|
| 1,951,945 | Olson | Mar. 20, 1934 |
| 2,597,028 | Pfann | May 20, 1952 |